United States Patent
Hutchison et al.

(10) Patent No.: US 9,726,915 B2
(45) Date of Patent: Aug. 8, 2017

(54) METHOD AND DEVICE TO MODIFY THE ELECTRICAL PROPERTIES OF AN ORGANIC AND/OR MOLECULAR MATERIAL

(71) Applicants: UNIVERSITE DE STRASBOURG (ETABLISSEMENT PUBLIC NATIONAL À CARACTÈRE SCIENTIFIQUE, CULTUREL ET PROFESSIONEL), Strasbourg (FR); CENTRE NATIONAL DE LA RECHERCHE SCIENTIFIQUE (ETABLISSEMENT PUBLIC NATIONAL À CARACTÈRE SCIENTIFIQUE ET TECHNOLOGIQUE), Paris (FR); CENTRE INTERNATIONAL DE RECHERCHE AUX FRONTIERES DE LA CHIMIE (FONDATION DE COOPÉRATION SCIENTIFIQUE), Strasbourg (FR)

(72) Inventors: James A. Hutchison, Strasbourg (FR); Cyriaque Genet, Strasbourg (FR); Thomas W. Ebbesen, Strasbourg (FR); Paolo Samori, Strasbourg (FR); Emanuele Orgiu, Strasbourg (FR); Jino George, Strasbourg (FR); Francesco Stellacci, Morges (CH)

(73) Assignees: UNIVERSITE DE STRASBOURG, Strasbourg (FR); CENTRE NATIONAL DE LA RECHERCHE SCIENTIFIQUE, Paris (FR); CENTRE INTERNATIONAL DE RECHERCHE AUX FRONTIERES DE LA CHIMIE, Strasbourg (FR)

( * ) Notice: Subject to any disclaimer, the term of this patent is extended or adjusted under 35 U.S.C. 154(b) by 0 days.

(21) Appl. No.: 14/900,324

(22) PCT Filed: Jun. 26, 2014

(86) PCT No.: PCT/IB2014/002183
§ 371 (c)(1),
(2) Date: Dec. 21, 2015

(87) PCT Pub. No.: WO2015/008159
PCT Pub. Date: Jan. 22, 2015

(65) Prior Publication Data
US 2016/0154258 A1 Jun. 2, 2016

Related U.S. Application Data

(60) Provisional application No. 61/977,737, filed on Apr. 10, 2014.

(30) Foreign Application Priority Data

Jun. 26, 2013 (EP) ..................................... 13305890

(51) Int. Cl.
*G02F 1/03* (2006.01)
*G02F 1/061* (2006.01)
(Continued)

(52) U.S. Cl.
CPC .............. *G02F 1/061* (2013.01); *G02B 5/008* (2013.01); *G02B 6/1225* (2013.01);
(Continued)

(58) Field of Classification Search
CPC .... G02B 5/008; G02B 17/004; G02B 6/1225; G02F 1/061; G02F 1/21
(Continued)

(56) References Cited

FOREIGN PATENT DOCUMENTS

WO 2013/017961 A2 2/2013

OTHER PUBLICATIONS

Abderrafia Moujoud et al.: "On the mechanism of conductivity enhancement and work function control in PEDOT: PSS film through UV-light treatment", Physica Status Soudi (A). vol. 207, No. 7, May 31, 2010 (May 31, 2010), pp. 1704-1707, XP055089167, ISSN: 1862-6300, DOI: 10.1002/pssa.200983711 Chapter: Results and discussion.
(Continued)

*Primary Examiner* — Tuyen Tra
(74) *Attorney, Agent, or Firm* — Young & Thompson

(57) ABSTRACT

Disclosed is a method to modify the electrical conductivity of an organic and/or molecular material including the steps of providing a reflective or photonic structure and of placing the organic and/or molecular material in or on the structure. The method also includes providing a structure (1) which has an electromagnetic mode which is by design, or can be
(Continued)

made by way of adjustment or tuning, resonant with a transition in the organic and/or molecular material (2) and controlling, in particular enhancing, the mobility of the charge carriers, and thus the electrical current, in the organic and/or molecular material (2), by way of strongly coupling the material (2) to the local electromagnetic vacuum field and exploiting the formation of extended macroscopic states in the material.

13 Claims, 11 Drawing Sheets

(51) Int. Cl.
  *G02F 1/21* (2006.01)
  *G02B 6/122* (2006.01)
  *H01L 51/05* (2006.01)
  *G02B 5/00* (2006.01)
  *G02B 17/00* (2006.01)

(52) U.S. Cl.
  CPC ............ *G02B 17/004* (2013.01); *G02F 1/21* (2013.01); *H01L 51/0558* (2013.01)

(58) Field of Classification Search
  USPC ....... 359/240, 245, 261, 366, 726–732, 850, 359/900; 428/209, 210, 409
  See application file for complete search history.

(56) References Cited

OTHER PUBLICATIONS

Jiri Janata et al.: "Conducting polymers in electronic chemical sensors", Nature Materials, vol. 2, No. I, Feb. 3, 2003 (Feb. 3, 2003), pp. 19-24, XP055088938, ISSN: 1476-1122, DOI: 10.1038/nmat768 Chapter: Intrinsic conduction.

Adi Salomon et al.: "Strong Coupling between Molecular Excited States and Surface Plasmon Modes of a Slit Array in a Thin Metal Film", Physical Review Letters, vol. 109, No. 7, Aug. 1, 2012 (Aug. 1, 2012), XP055088797, ISSN: 0031-9007, DOI: 10.1103/PhysRevLett.109.073002 the whole document.

Huang J et al.: "Investigation of the Effects of Doping and Post-Deposition Treatments on the Conductivity, Morphology, and Work Function of Poly(3,4-ethylenedioxythiophene)/Poly(styrene sulfonate) Films", Advanced Functional Materials, Wiley-V C H Verlag GmbH & Co. KGAA, DE, vol. 15, No. 2, Jan. 1, 2005 (Jan. 1, 2005), pp. 290-296, XP009128204, ISSN: 1616-301X the whole document.

Nan Guo et al.: "Enhanced plasmonic resonant excitation in a grating gated field-effect transistor with supplemental gates References and linksAn Intensity Modulator for Terahertz Electromagnetic Waves Utilizing Two-Dimensional Plasmon Resonance in a Dual-Grating-Gate High-Electron-Mobility Transistor", Opt. Express, Jan. 1, 2013 (Jan. 1, 2013), pp. 1606-1614, XP055168333.

International Search Report, dated Feb. 19, 2015, from corresponding PCT application.

METHOD AND DEVICE TO MODIFY THE ELECTRICAL PROPERTIES OF AN ORGANIC AND/OR MOLECULAR MATERIAL

BACKGROUND OF THE INVENTION

Field of the Invention

The present invention is related to the field of organic or molecular materials and their use in connection with electricity, more specifically in electronic, electro-optic, optoelectronic and photovoltaic implementations.

Description of the Related Art

Organic electronics has been widely developed over the past decades because of its potential to simplify and reduce the cost of fabrication of electronic components such as displays, transistors, photovoltaics, medical devices and sensors (see for example: "Materials and applications for large area electronics: solution-based approaches", Arias et al., Chem. Rev. 2010, 110, 3-24-hereinafter "ref. 1"/"Charge transport physics of conjugated polymer field-effect transistors", H. Sirringhaus et al., Adv. Mater. 2010, 22, 3893-3898—hereinafter "ref. 2").

Organic electronics include the use of both molecular materials and polymers which can provide mechanical flexibility and be easily processed on a large scale, also leading to quite inexpensive consumer devices.

One of the most challenging problems for organic electronics is the low charge carrier mobility in organic materials, as well as the disorder in these materials, which hamper its more wide-spread use for devices (see for instance ref. 1: p 7, col 2, $1^{st}$ paragraph and $3^{rd}$ paragraph; p 12, column 1, $3^{rd}$ paragraph; p 13, col 1, $1^{st}$ paragraph). Much effort over the past decades has therefore been focused on optimizing the organisation of the material or the devices to improve carrier mobility between molecules or molecular units. Nevertheless, mobilities are in the most optimized configurations reported in the literature (refs. 1, 2) in the order of 0.1 cm$^2$/Vs but often a couple of orders of magnitude lower.

This compares very unfavourably with inorganic semiconductors such as Si which is on the order of 10$^3$ cm$^2$/Vs due to regular periodic structure of such materials and the associated well defined electronic bands. The low carrier mobility in organic materials stems from the fact that the carriers hop from one molecule or moiety to another in the material.

Therefore, there is a strong demand for significantly improving this feature and to overcome this main drawback of organic and molecular materials, in order to be able to fully exploit the potential use of such materials in the concerned technological fields and technical applications.

On the other hand, it is known that light and matter can enter into the strong coupling regime by exchanging photons faster than any competing dissipation processes. This can be achieved by placing the material in a confined electromagnetic environment, such as a Fabry-Perot (FP) cavity composed of two parallel mirrors that is resonant with an electronic transition in the material. Strong coupling leads to the formation of two polaritonic states, P+ and P−, separated by the so-called Rabi splitting. According to quantum electrodynamics, in the absence of dissipation, the Rabi splitting is given by:

$$\hbar\Omega_R = 2\sqrt{\frac{\hbar\omega}{2\varepsilon_0 v}} \cdot d \cdot \sqrt{n_{ph}+1} \quad (1)$$

where $\hbar\omega$ is the cavity resonance or transition energy, $\varepsilon_0$ the vacuum permittivity, v the mode volume, d the transition dipole moment of the material and $n_{ph}$ the number of photons present in the system. The last term implies that even in the dark, the Rabi splitting $\hbar\Omega_R$ has a finite value which is due to the interaction with the vacuum electromagnetic field. This vacuum Rabi splitting can be further increased by coupling a large number N of oscillators to the electromagnetic mode since $\hbar\Omega_R^N \propto \sqrt{N}$. Vacuum Rabi splittings as large as 1 eV have been reported for strongly coupled molecules, thereby significantly modifying the electronic structure of the molecular material as can be seen in the work function, the chemical reactivity and the ground state energy shift (see in particular: Haroche, S. "Cavity quantum electrodynamics" in: J. Dalibard, J. M. Raimond, J. Zinn-Justin (Eds.), Fundamental Systems in Quantum Optics, Les Houches Summer School, Session LIII, North Holland, Amsterdam. 1992/Schwartz, T., Hutchison, J. A., Genet, C. & Ebbesen, T. W. "Reversible switching of ultra-strong coupling" Phys. Rev Lett. 106, 196405 (2011)/Kéna-Cohen, S., Maier, S. A. & Bradley, D. D. C. "Ultrastrongly coupled exciton-polaritons in metal-clad organic semiconductor microcavities" Adv. Opt. Mater. 1, 827-833 (2013)/Hutchison, J. A., Schwartz, T., Genet, C., Devaux, E. & Ebbesen, T. W. "Modifying chemical landscapes by coupling to the vacuum fields" Angew. Chem., Int. Ed. 51, 1592-1596 (2012)/Hutchison, J. A., Liscio, A., Schwartz, T., Canaguier-Durand, A., Genet, C., Palermo, V., Samori, P. & Ebbesen, T. W. "Tuning the work-function via strong coupling" Adv. Mater. 25, 2481-2485 (2013)/Canaguier-Durand, A., Devaux, E., George, J., Pang, Y., Hutchison, J. A., Schwartz, T. Genet, C., Wilhelms, N., Lehn, J.-M. & Ebbesen, T. W. "Thermodynamics of molecules strongly coupled to the vacuum field" Angew. Chem., Int. Ed. In press (2013)).

From WO 2013/017961 in particular, it is known to make use of strong coupling in order to modify the work function of materials (i.e. the energy required to extract an electron from the material) and the rate of chemical reactions.

SUMMARY OF THE INVENTION

Now, the inventors have found, in an unexpected and surprising manner, that the mobility of charge carriers and the electrical conductivity in organic or molecular materials can be influenced by strongly coupling said materials to the vacuum field.

Thus, the main object of the present invention is a method to modify the electrical properties of an organic and/or molecular material comprising the steps of providing a reflective or photonic structure and of placing said organic and/or molecular material in or on said structure, method characterized in that it consists further in providing a structure which has an electromagnetic mode which is by design, or can be made by way of adjustment or tuning, resonant with a transition in said organic and/or molecular material and in controlling, in particular enhancing, the conductivity, and thus the mobility of the charge carriers, resulting in an increased electrical current, in said organic and/or molecular material, by means of strongly coupling said material to the local electromagnetic vacuum field and exploiting the formation of states of spatial extension exceeding the size of the molecules or polymer chains of said material.

So, the basic principle of the invention consists in injecting carriers into hybrid light-matter or polaritonic states, resulting from strong coupling as mentioned before.

In these specific circumstances, P+ and P− are coherent collective states that extend over the mode volume and may involve ~$10^5$ oscillators. This collective nature has been demonstrated by the coherent fluorescence of P− over micrometers distances in strongly coupled molecular states. When P− is populated, a polariton is formed, a quasi-Bosonic particle, leading to known physical phenomenons such as lasing and the Bose-Einstein condensation of polaritons. The P− polariton has a very small effective transverse mass $m_{//}^p$ (parallel to the plates in the FP cavity). This can be derived from the polariton dispersion:

$$\frac{1}{m_{//}^p} = \frac{d^2\omega_c(k_{//})}{dk_{//}^2} \Rightarrow m_{//}^p = \frac{2\pi n_c}{cL} \approx 10^{-5} m_e \quad (2)$$

where $k_{//}$ is the in-plane momentum of the photon, $\omega_c$ the cavity resonance, $n_c$ the refractive index in the cavity, c the velocity of light and L the cavity length (see for example: Deng, H., Haug, H. & Yamamoto, Y. Exciton-polariton Bose-Einstein condensation. Rev. Mod. Phys. 82, 1490-1537 (2010)).

The method according to the invention may also comprise or show one or several of the following secondary features or alternatives:
- the Q-factor, defined as the ratio of the wavelength of the resonance divided by the half-width of the resonance, of the resonant electromagnetic mode is comprised between 10 and 1 000, preferably between 10 and 100;
- the electromagnetic mode is a surface plasmon mode;
- the electromagnetic mode is a cavity mode, preferably defined by two opposed mirror structures (for example two parallel planar mirrors);
- the reflective structure comprises at least one metallic surface, for example made of a metal film or of two opposed metal films;
- the concerned transition in the molecules of the material is an electronic transition;
- the concerned transition in the molecules of the material is a vibrational transition.

According to an advantageous embodiment of the invention, the method consists more precisely, by means of coupling to local electromagnetic vacuum field and exploiting the resulting rearrangement of the energy levels of the molecules of the material, in inducing the formation of hybrid light-matter Dicke states in the organic material in order to increase its conductivity and the charge carrier mobility, said Dicke states extending over a large number of molecules of the material, preferably over at least 100 nm each.

The low effective mass of the P− polaritons will reduce the scattering by photons and thereby increase the mobility of carriers in this state. Carrier mobility should also benefit from the extended coherence associated with polaritonic states as compared to the normal carrier mobilities, which is limited by the hopping between molecules and by scattering induced by molecular disorder.

In practice, the previously described method can be applied in a functional device comprising said reflective or photonic structure, said device being one of an electronic device, an electro-optical device, an optoelectronic device, a photovoltaic device or a light emitting device, the conductivity of which are significantly increased as a result of said method.

The invention also encompasses an electronic, electro-optical, optoelectronic, photovoltaic or light emitting device comprising organic and/or molecular material located in or on a reflective or photonic structure, device characterized in that said structure has an electromagnetic mode which is by design or can be made by way of adjustment or tuning, resonant with a transition in said organic material and in controlling, in particular enhancing, the conductivity and therefore the mobility of the charge carriers, and thus increasing the electrical current, in said organic and/or molecular material, by means of strongly coupling said material to the local electromagnetic vacuum field and exploiting the formation of extended macroscopic states in said material, namely states of spatial extension exceeding the size of the molecules or polymer chains of said material.

Preferably, said device incorporates or makes use of one or several of the previously mentioned secondary features.

Advantageously, the reflective or photonic structure consists of an optical microcavity, preferably a Fabry-Perot cavity, the electromagnetic mode being a cavity mode.

More precisely, the structure may comprise two metallic or dielectric mirrors forming with the organic material a sandwich structure, the distance between said mirrors being adjusted to resonate with an electronic transition in the molecules of said material, said opposite mirrors being arranged preferably transversally or longitudinally to the direction of displacement of the charge carriers.

Furthermore, the invention also comprises a machine or apparatus able and intended to perform at least one electronic, electro-optic, optoelectronic or optic function, wherein said machine or apparatus comprises at least one device as mentioned before, said device being designed to perform the method set out previously.

BRIEF DESCRIPTION OF THE DRAWING FIGURES

The present invention will be further described hereinafter by way of non limitative examples and in connection with the attached schematical drawings wherein.

Figure 2A:
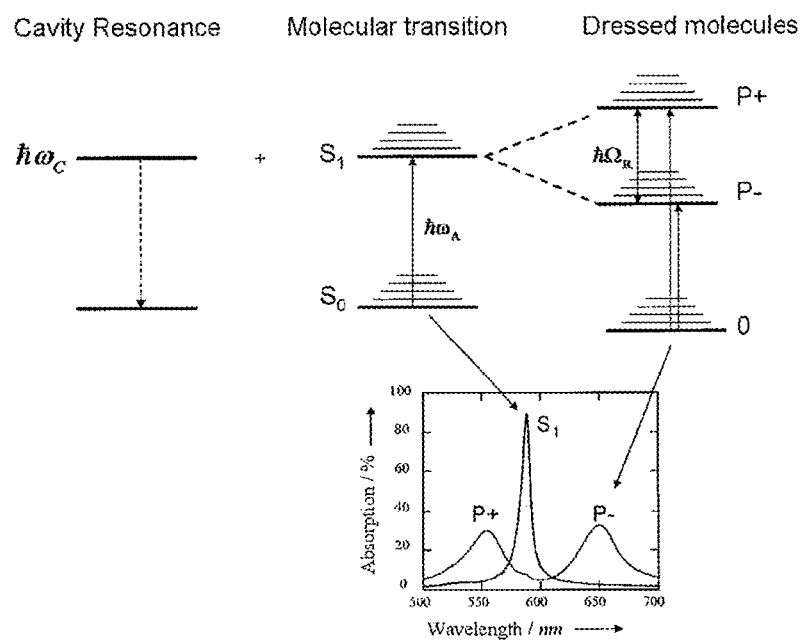
FIG. 2A is a schematic illustration of strong coupling between a cavity resonance and a molecular material, inducing the formation of the Dicke states (P− and P+), the corresponding absorption spectra before and after coupling being also shown (the separation of P+ and P− corresponding to the Rabi splitting)
Figure 2B:
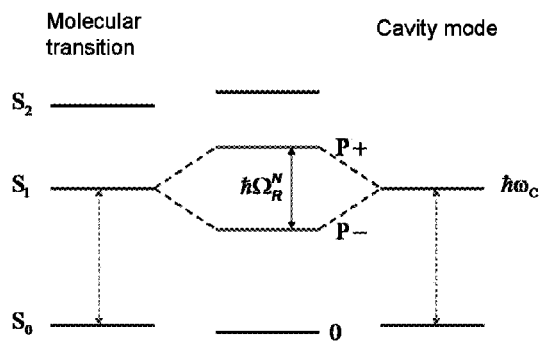
Figure 2C:
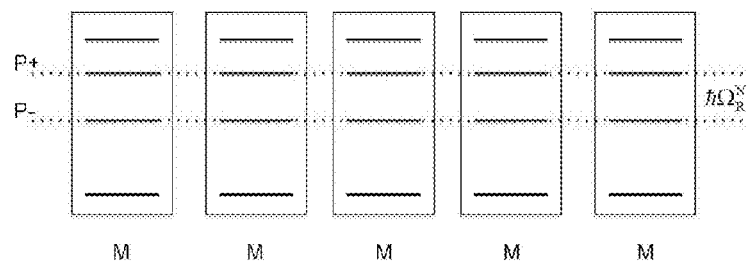
Figure 3A:
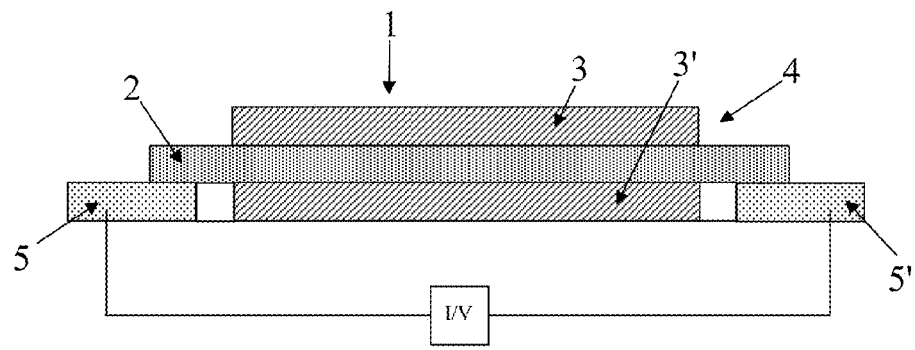
Figure 3B:
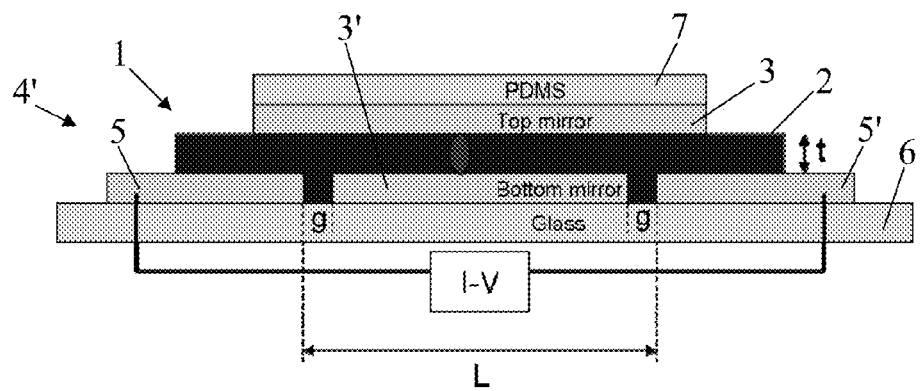
Figure 4A:
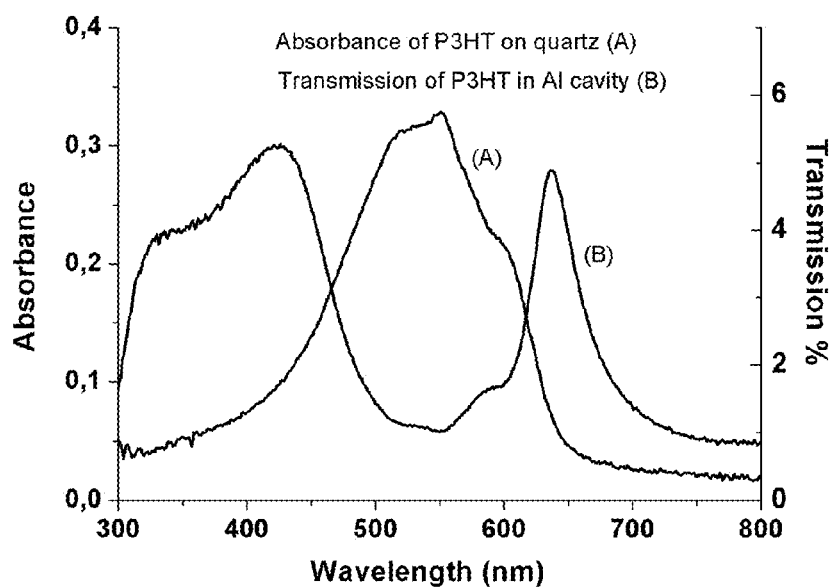
Figure 4B:
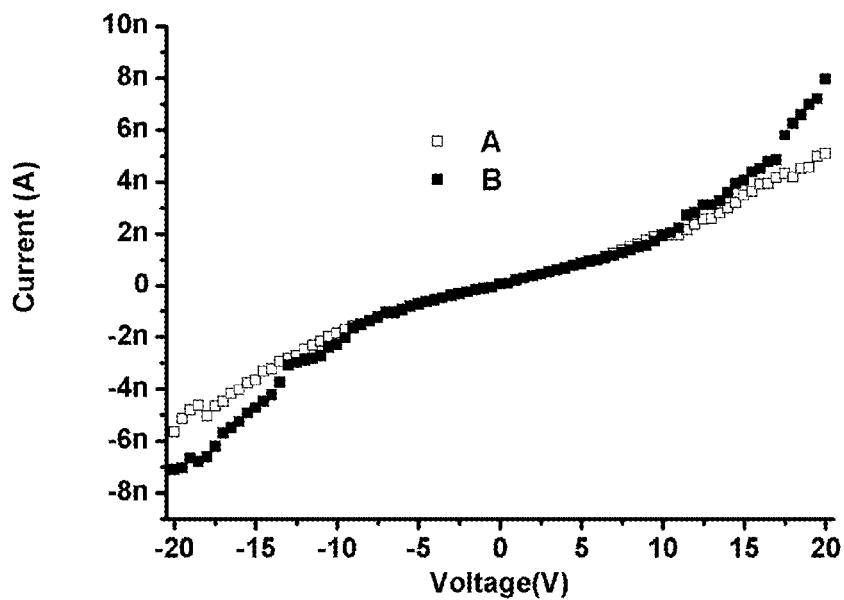
Figure 5A:
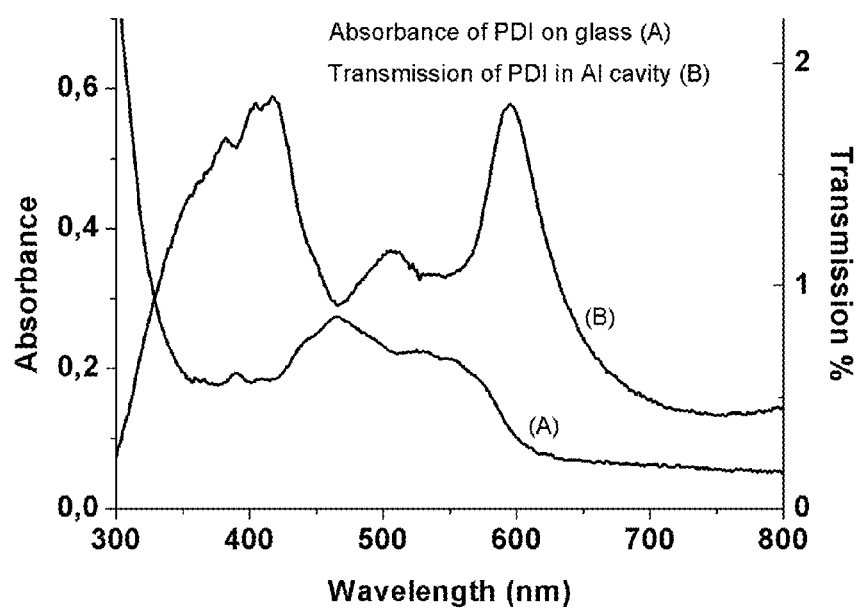
Figure 5B:
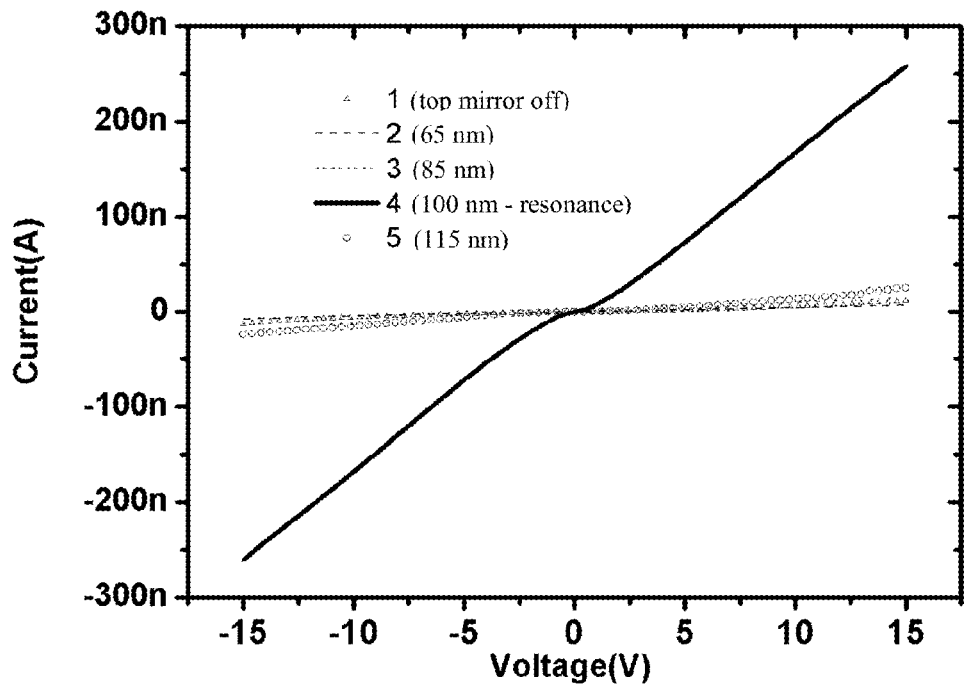
Figure 6A:
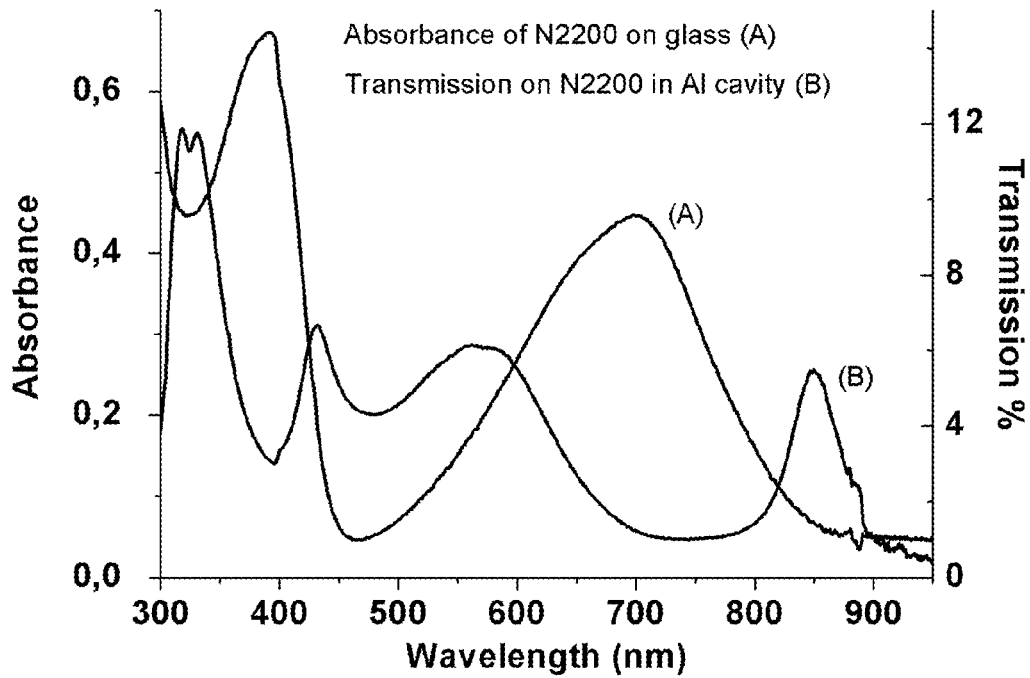
Figure 6B:
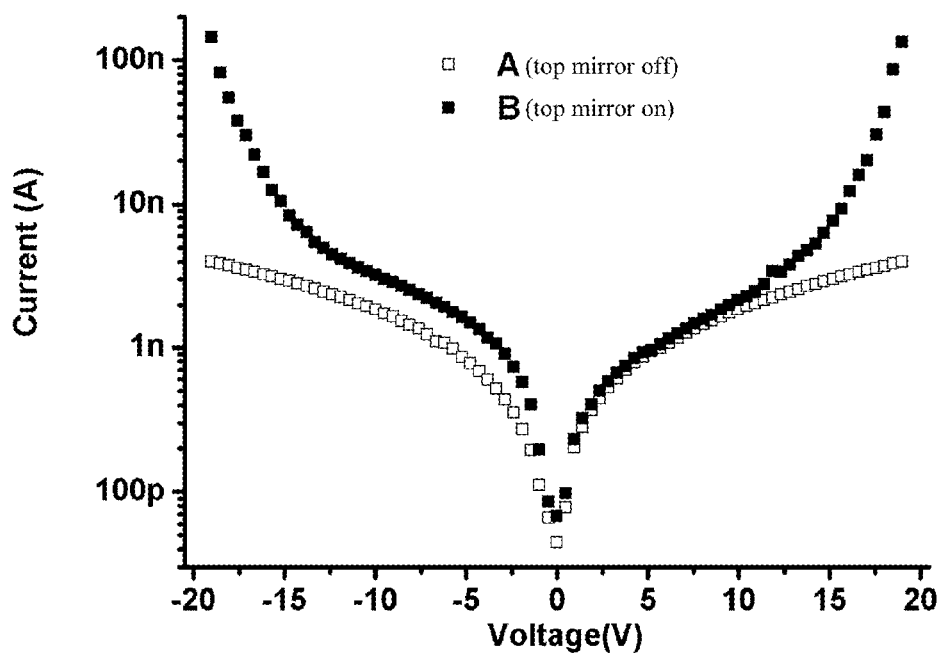
Figure 6C:
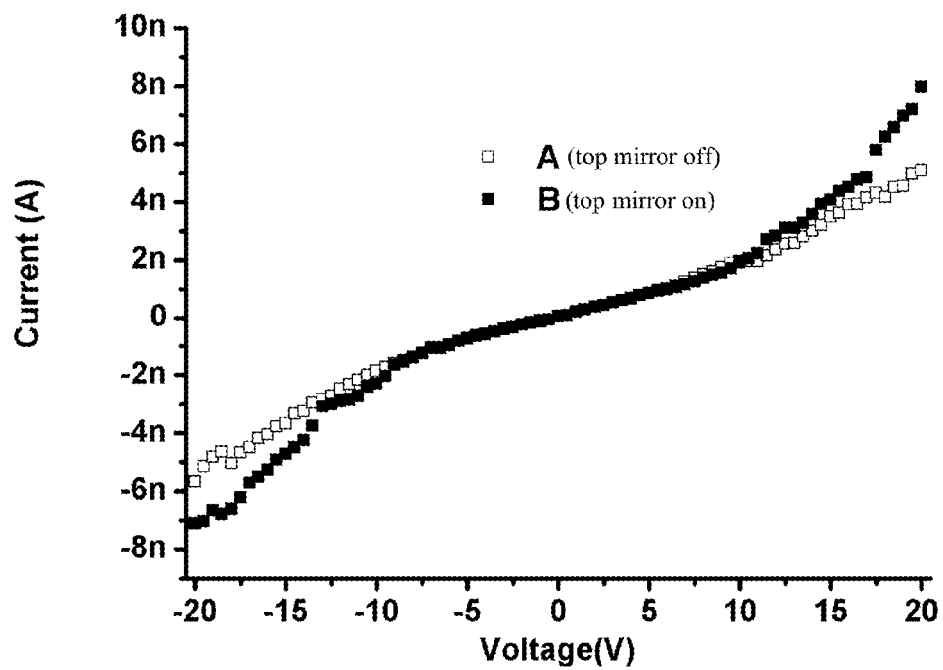
Figure 7A:
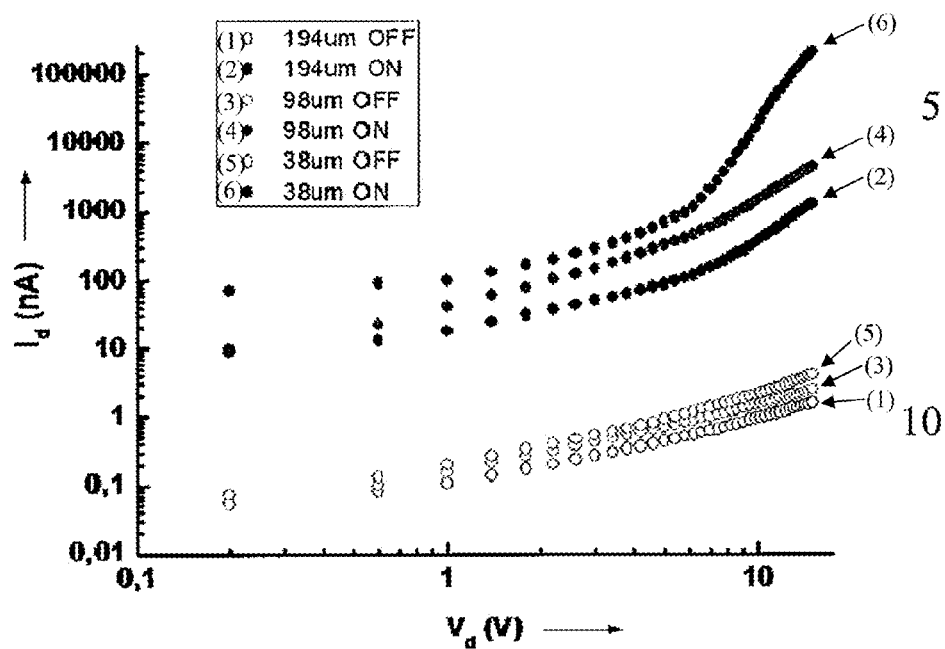
Figure 7B:
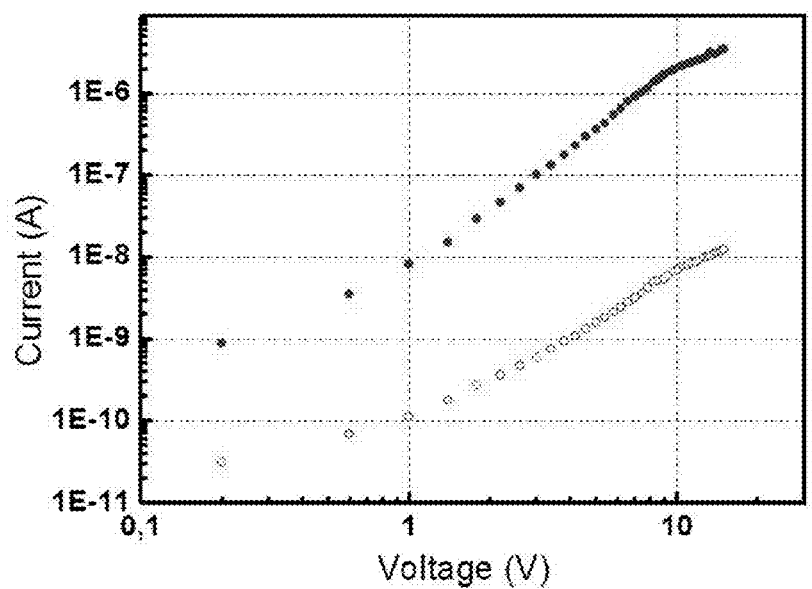
Figure 8:
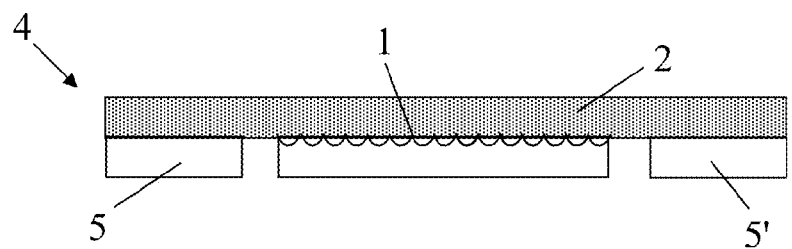
Figure 9:
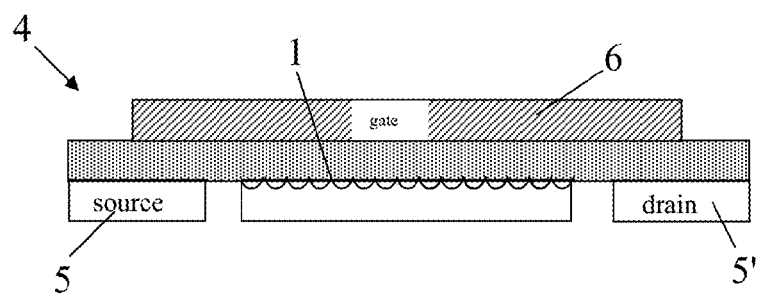
Figure 10:
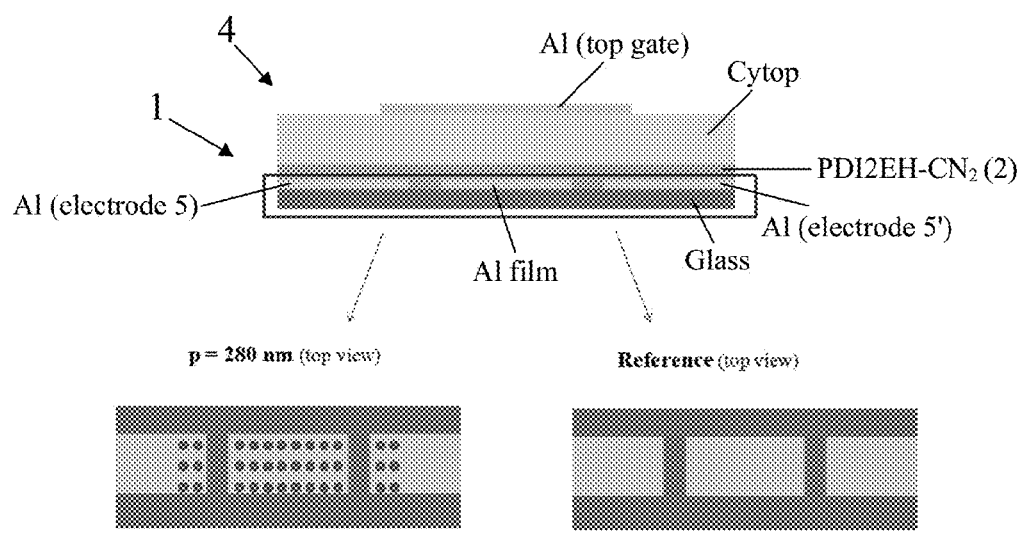
Figure 11A:
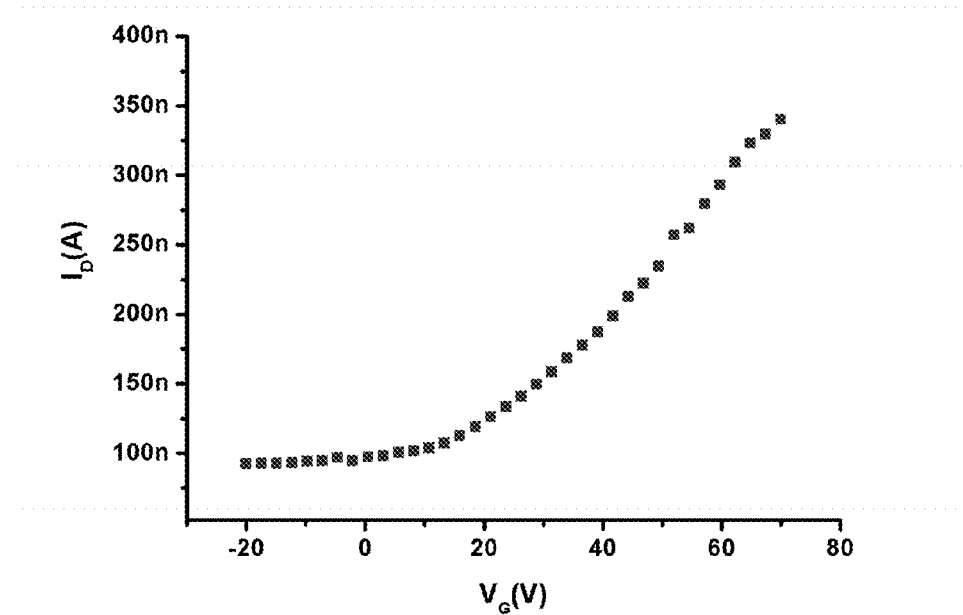
Figure 11B:
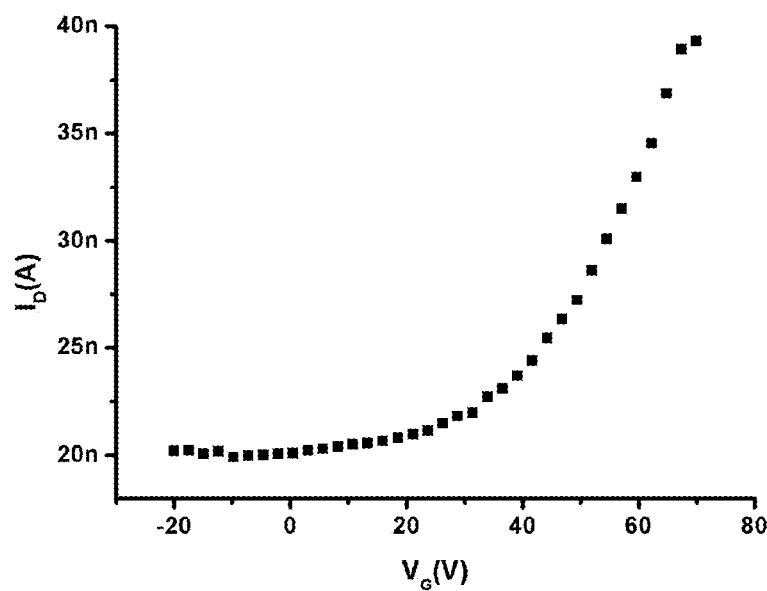
Figure 12:
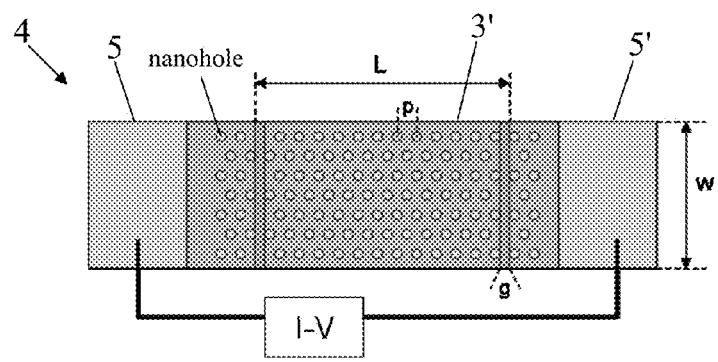
Figure 13A:
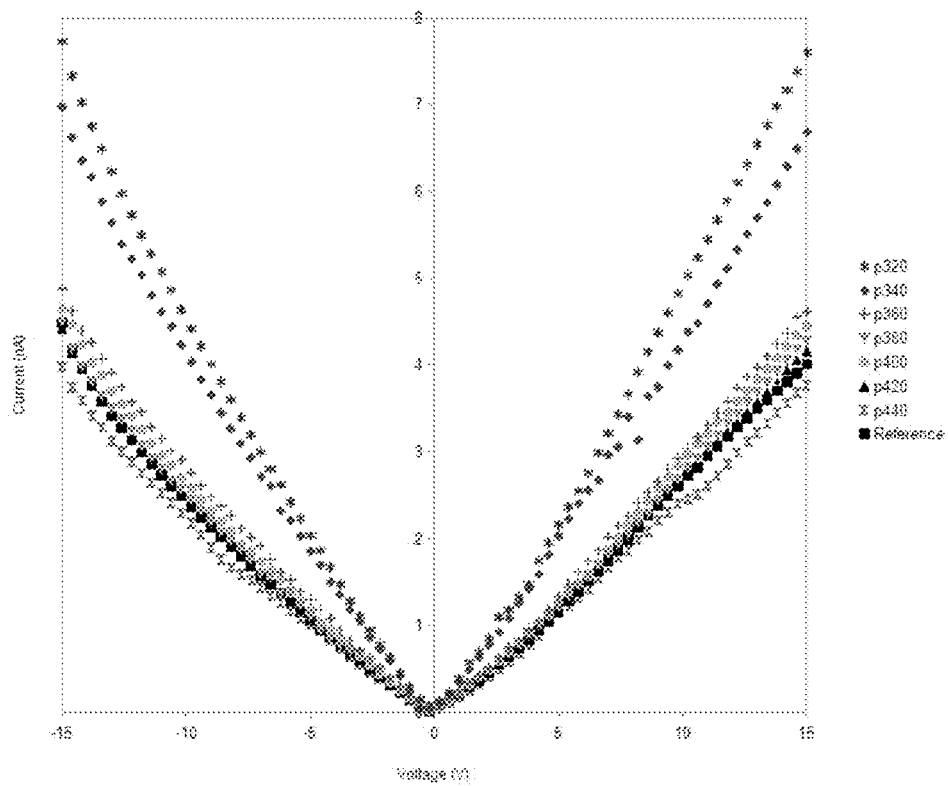
Figure 13B:
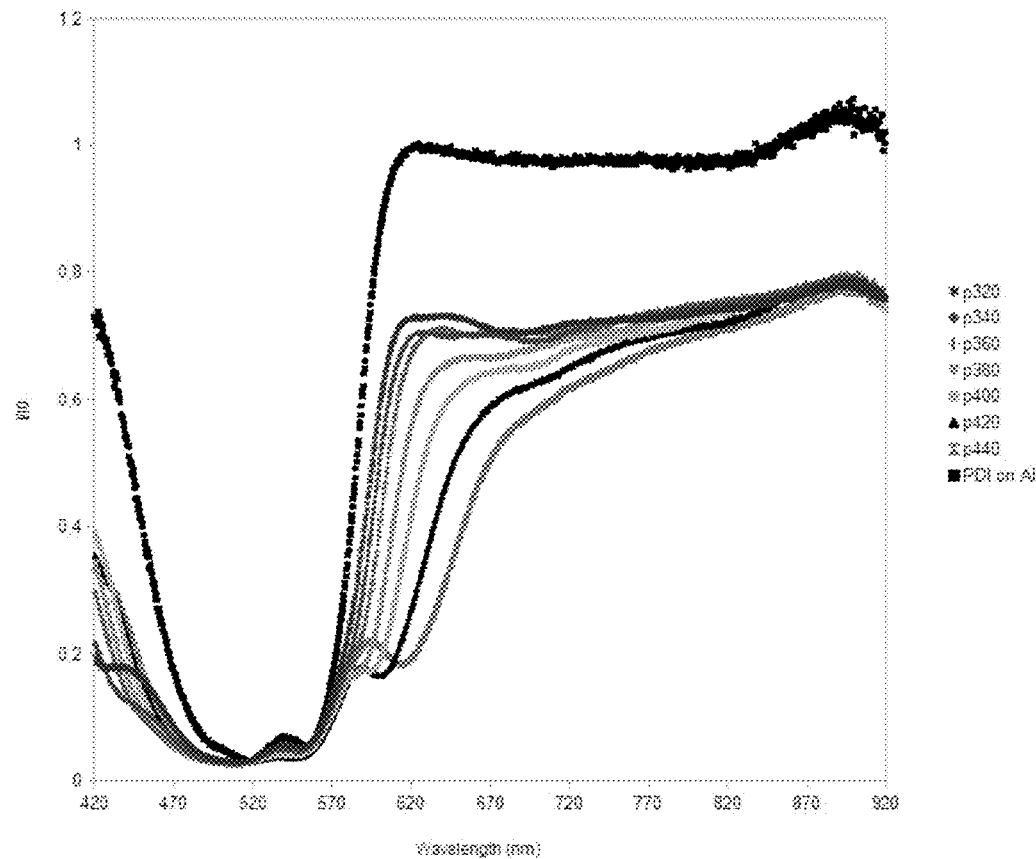
Figure 14:
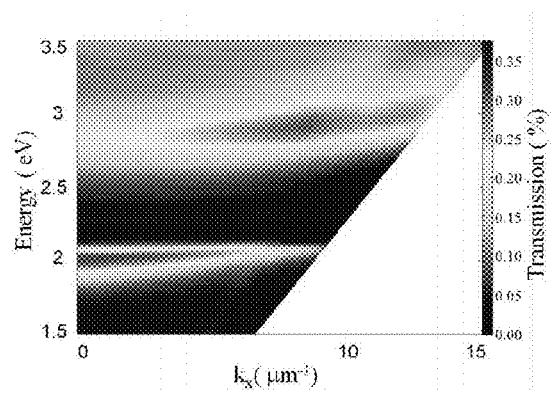

FIGS. 2B to 2E illustrate respectively: FIG. 2B: the strong coupling between a molecular electronic transition ($S_0$ to $S_1$) and an optical cavity mode of the same energy ($\hbar\omega_c$) (two new hybrid light matter states P+ and P− are formed separated by the Rabi splitting $\hbar\Omega_R^N$)/FIG. 2C: the collective nature P+ and P− forming a coherent state involving many molecules or molecular units (M)/FIG. 2E: absorbance spectra (AS) of thin films of the organic semiconductors PDI2EH-CN$_2$, PDI2EH-Br$_2$ and P(NDI2OD-T2) respectively (these three materials being represented in FIG. 2D) and the corresponding transmission spectra (TS) of the same films inside a Fabry-Perot cavity whose λ/2 resonance matches the center of the molecular absorbance (the used Fabry-Perot device is formed by two parallel 20 nm Al mirrors, one deposited on a glass substrate and the other on a PDMS block. The separation of the two TS peaks in each spectrum indicates the Rabi splitting);

FIG. 3A is a simplified schematic representation of an experimental setup allowing to carry out conductivity measurements on a device according to the invention and comprising a strongly coupled organic material sandwiched between two mirrors (the distance between the electrodes is 22 µm and the gap between the electrodes and the bottom mirror is about 1 µm);

FIG. 3B is a schematic representation of a setup similar to the setup of FIG. 3A, but with the top and bottom mirrors being provided with additional insulation layers (the top mirror is deposited on a PDMS block so as to be easily removable and allow comparison of conductivity with and without cavity mode);

FIG. 4 shows (in relation to the setup of FIG. 3A), in FIG. 4A: absorption/transmission spectra of the bare P3HT and of strongly coupled P3HT; in FIG. 4B, I-V (Current Voltage) curves with (A) and without (B) the top mirror in place, i.e. in the uncoupled and coupled regimes respectively;

FIG. 5 illustrates (in relation to the setup of FIG. 3A), in FIG. 5A, the PDI (N1100) spectra in absence (A) and presence of strong coupling (B) and, in FIG. 5B, I-V curves as a function of the spacing between the two mirrors forming the cavity (N.B.: At resonance a dramatic increase in current is observed);

FIG. 6 illustrates (in relation to the setup of FIG. 3A), in FIG. 6A, the absorption/transmission spectra of bare (A) and strongly coupled (B) P(NDI2OD-T2) films (between two Ag mirrors separated by 130 nm), in FIG. 6B, I-V curves in the same conditions as for FIG. 6A and, in FIG. 6C, I-V curves for an off-resonance cavity where the Ag mirrors are separated by 65 nm;

FIG. 7A illustrates [current I-voltage V] curves for PDI (N1100) films of 100 nm thickness obtained with the setup of FIG. 3A, the OFF-data curves—(1), (3) and (5)—having been obtained with the bare film and the ON-data curves—(2), (4) and (6)—having been obtained with the strong coupling active (top mirror in place on the material sample);

FIG. 7B illustrates, in connection with the setup of FIG. 3B, the conductivity of a 50 nm thick PDI2EH-$CN_2$ layer between insulated mirrors (empty circles: without top mirror/full circles: with top mirror);

FIG. 8 shows a device according to an other embodiment of the invention, wherein the photonic structure is a plasmonic surface structure on which the organic and/or molecular material is located;

FIG. 9 is a device similar to the device of FIG. 8, wherein a gate element has been added;

FIG. 10 illustrates a setup for evaluating gating experiments on a nanohole array device;

FIGS. 11A and 11B are curves illustrating the transfer characteristics ($I_D$-$V_G$) of the top-gate bottom contact FETs realised according to the construction shown on FIG. 10;

FIG. 12 is a schematic representation (partly transparent top view) of an experimental setup used to measure polariton conductivity using surface plasmon resonances generated by an hexagonal array of nanoholes;

FIGS. 13A and 13B are respectively I-V (current-voltage) curves (FIG. 13A) as a function of the hexagonal array period of the setup configuration of FIG. 12 and reflection spectra curves (FIG. 13B) of the hole arrays (covered with the organic semiconductor material—here PDI2EH-$CN_2$) as a function of the period corresponding to the samples evaluated in FIG. 13A, and, FIG. 14 shows by way of example the angular dispersion of PDI2EH-$CN_2$ in a Fabry-Perot cavity.

DETAILED DESCRIPTION OF THE INVENTION

As set out before, the invention concerns a method to modify the electrical conductivity of an organic and/or molecular material comprising the steps of providing a reflective or photonic structure and of placing said organic and/or molecular material in or on said structure.

According to the invention, said method consists further in providing a structure 1 which has an electromagnetic mode which is by design, or can be made by way of adjustment or tuning, resonant with a transition in said organic and/or molecular material 2 and in controlling, in particular enhancing, the mobility of the charge carriers, and thus the electrical current, in said organic and/or molecular material 2, by means of strongly coupling said material 2 to the local electromagnetic vacuum field and exploiting the formation of extended macroscopic states in said material.

More particularly, said method consists, by means of coupling to local electromagnetic vacuum field and exploiting the resulting rearrangement of the energy levels of the molecules of the material, in inducing the formation of hybrid light-matter Dicke states in the organic material in order to increase its conductivity and the charge carrier mobility, said Dicke states extending over a large number of molecules of the material, preferably over an area extending at least 100 nm in all directions.

Figure 1:
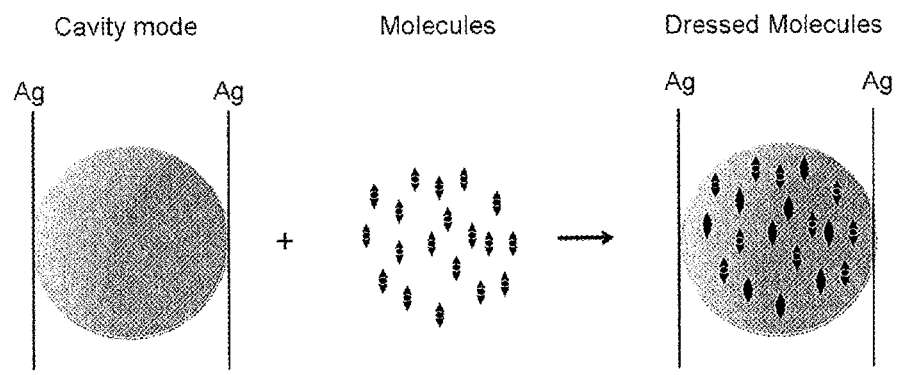
FIG. 1 is a schematic illustration of strong coupling of an optical mode between two Ag mirrors with molecules to give rise to dressed molecules.

Various experiments conducted by the inventors have shown that the collective Dicke states (P−/P+), formed by strongly coupling organic material to an optical mode and usually formed by about $10^3$ to $10^5$ molecules (or oscillators) interacting with said optical mode (FIG. 1), allow to improve charge carrier mobility and conductivity.

These improvements seem to result from the fact that the Dicke states extend over dimensions associated with the mode, which is orders of magnitude larger than the nanometer size molecules of the organic material.

Furthermore, the experiments show that the inventive method may be applied with expected beneficial increase of conductivity to all types of molecules and materials having an absorption transition.

A first type of experimental setups used by the inventors to collect data are shown on FIGS. 3A and 3B, as two different embodiments.

As shown on FIG. 3A, a device 4 able to induce strong coupling was built. In this device, the material 2 is placed between two parallel mirrors (top mirror 3 and bottom mirror 3') whose distance was designed to be such that it is optically resonant with the electronic transition of the material. The absorption spectrum was recorded before and after strong coupling. Once the spectrum indicates strong coupling by the appearance of two new absorption peaks (as in FIG. 2A) with the appropriate separation, then the conductivity is measured and its value compared to that in the absence of the top mirror 3.

A first series of experiments were performed by the inventors with said first experimental setup of FIG. 3A, using three different organic semiconductors known to be air-stable and display good field-effect mobilities (~1 $cm^2 \cdot V^{-1} \cdot s^{-1}$).

The following examples 1 to 3 and the related FIGS. 4 to 7 describe and illustrate the details and the results of this first series of experiments illustrating the surprising and advantageous effects resulting from putting into practice the invention.

Example 1: P3HT (poly(3-hexyl thiophene)) (Commercial Name Sepiolid P200® by BASF)

Exceptionally large Rabi splitting, on the order of 1.2 eV is observed for P3HT as shown in FIG. 4A. P3HT being a hole carrier (p-type semiconductor, HOMO level at −4.8 eV, LUMO level at −2.3 eV), Al mirrors 3, 3' and electrodes 4, 4' were used for the experiment which has a low work function (ca. −4.2 eV). The conductivity results are the same for both the bare and the strongly coupled material as shown in FIG. 4B. The energy mismatch between the HOMO of the P3HT and the work function of Al (HOMO$_{[P3HT]}$−Φ$_{[Al]}$=0.6 eV) gives rise to an injection barrier for the majority carriers i.e. holes which dominates the current-voltage (I-V) curve.

Example 2: PDI or PDIF-CN2: (N,N'-bis(n-fluoro-alkyl)-(1,7 and 1,6)-dicyanoperylene-3,4:9,10-bis (dicarboximide), (Commercial Name: ActivInk® N1100 by Polyera Corporation)

PDI is an n-type semiconductor with the LUMO level at −4.5 eV. FIG. 5A shows the spectra before and after strong coupling with the cavity (Al mirrors). The cavity was here 100 nm wide to provide the resonance with the PDIF. As can be seen, in the blue (B) curve two peaks appear separated by 1 eV. FIG. 5B shows the I-V curves for different cavity widths or resonances. As can be seen, when the cavity is in exact resonance the current increases dramatically by a factor of 20. To estimate the change in the carrier mobility a smaller distance was used between the electrodes (5.2 μm) to reach the space charge limited current (SCLC) regime. The change in carrier mobility went from 0.13 cm$^2$/Vs to 0.56 cm$^2$/Vs, which represents an over 4 fold increase.

Example 3: (P(NDI2OD-T2)) Poly([N,N'-bis(2-octyldodecyl)-naphthalene-1,4,5,8-bis(dicarboxim-ide)-2,6-diyl]-alt-5,5'-(2,2'-bithiophene))) (Commercial Name: ActivInk® N2200 by Polyera Corporation)

P(NDI2OD-T2) is a n-type polymeric semiconductor with the LUMO at −4 eV.

FIG. 6A compares the spectrum of the bare polymer with that of the strongly coupled system (cavity width 130 nm, Ag mirrors) and the Rabi splitting is on the order of 0.7 eV. The I-V curves also show dramatic differences, especially above 15 V where a 30 fold increase in current is recorded as shown in FIG. 6B. When the cavity is off-resonance, the change in conductivity is negligible (FIG. 6C). The SCLC carrier mobility change was also measured and found to increase 10 fold (from ca. 0.15 cm$^2$/Vs to 1.4 cm$^2$/Vs).

The experimental data shown on FIG. 7A (I-V curves) for PDI have been obtained for different distances (38 μm, 98 μm and 194 μm) between the two electrodes 5 and 5' (source and drain) and with a gap between bottom mirror 3' and source or drain reduced to 150 nm. One can notice that for the shortest distance the ON/OFF current ratio is 10$^5$ at 10 V.

Figure 2D:
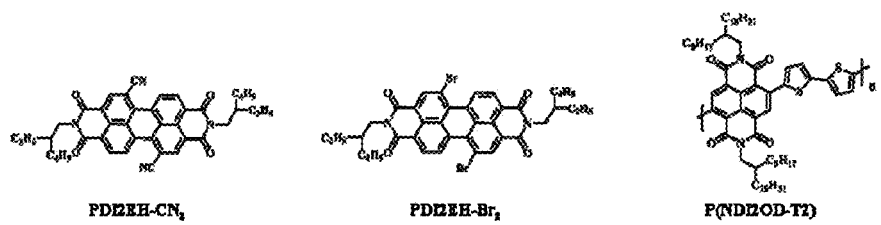
Figure 2E:
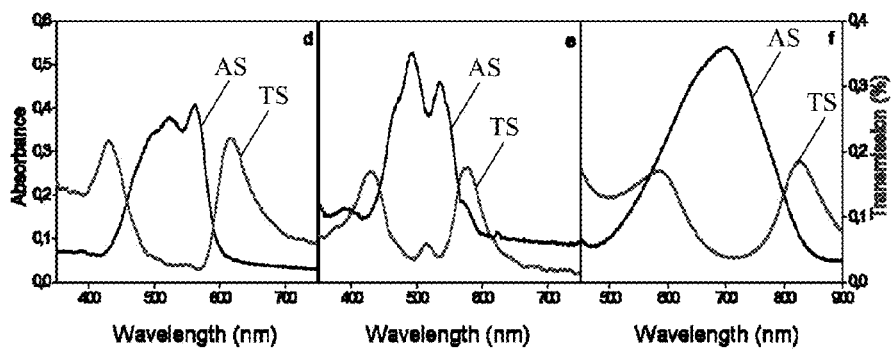

In the context of a second series of experiments, the inventors used again three different organic semiconductor materials, namely naphthalene-bis(dicarboximide) polymer known as P(NDI2OD-T2) and perylene di-imide (PDI) small molecule derivatives shown in FIG. 2D. In addition, these compounds possess a well-defined absorption band that can be used to strongly couple them to a Fabry-Perot (FP) cavity. FIG. 2E show the exceptionally large Rabi splitting or coupling strengths when a thin film of any of these three materials is sandwiched between two metallic mirrors whose distance is tuned to match the optical resonance of the compounds. The largest splitting between the polaritonic states was found to be ~0.9 eV for PDT derivatives such as PDI2EH-CN$_2$ corresponding to 38% of the transition energy. An example of the dispersive nature of these states is shown for PDI2EH-CN$_2$ on FIG. 14.

As before for examples 1 to 3, and in order to assess the conductivity of polaritons versus that of normal carriers, current-voltage (I-V) curves were recorded for thin films of the organic semiconductors between two Al electrodes 5, 5' in the absence of mirrors, then with a bottom Al 3' mirror alone and finally with both bottom and top mirrors 3 and 3'.

Now, taking into consideration the significant possibility that the bottom and top metallic mirrors 3', 3 may act as conduits for current, the inventors used the device 4' of FIG. 3B to perform these additional experiments.

As shown on FIG. 3B, the mirrors of device 4' are further insulated by depositing a 20 nm SiOx film 6 on the bottom mirror 3' using the Zeiss Auriga FIB apparatus and a 30 nm ozonolated PDMS layer 7 on the top mirror 3, and by spin-coating a 50-nm-thick film 2 of PDI2EH-CN$_2$ in between.

Even in these non-optimal (or rather unfavorable) conditions, a conductivity increase of nearly 2 (two) orders of magnitude was observed for PDI2EH-CN$_2$ at least, as shown on FIG. 7B.

For the two other tested materials in this second series of experiments realised with the non-optimal setup construction of FIG. 3B, namely P(NDI2OD-T2) and PDI2EH-Br$_2$, no noticeable current increase could be evidenced by the inventors. This point will be discussed later on herein.

The gap distance, g in FIG. 3B, between the bottom mirror 3' and the electrodes 5 and 5' was found to be an important construction parameter. Indeed, if the distance is too large compare to the resonant dimensions in the cavity, the current would flow through an uncoupled area with orders of magnitude larger resistance. Therefore the gap was kept at 200 nm for all measurements.

The above examples of both series of experiments confirm that indeed charge carrier mobility and conductivity in organic materials can be dramatically enhanced by strong coupling. More precisely, the experimental data lead to the conclusion that the increase of the conductivity in a given material is directly resulting from an equivalent increase in charge carrier mobility in said material.

Since organic conductors and devices are generally sandwiched between two electrodes to ensure even current distribution, the strong coupling effect can be added by simply tuning the distance between the two metallic electrodes so that they form a resonant mode with the electronic transition in the material.

According to the invention, the optical resonance can also be provided by surface plasmon modes and other photonic structures, and can be adapted by the skilled person for the device design for a given application.

Indeed, as surface plasmon (SP) modes may be strongly coupled to molecular materials (see previously mentioned publications of Schwartz T. et al. and Hutchison J. A. et al., as well as Aberra Guebrou, S., Symonds, C., Homeyer, E., Plenet, J. C., Gartstein, Y. N., Agranovich, V. M. & Bellessa, J. "Coherent emission from a disordered organic semiconductor induced by strong coupling to surface plasmons" Phys. Rev. Lett. 108, 066401 (2012)), an experimental setup was realised wherein periodic arrays of dimples (indentations) and holes milled by Focused Ion Beam or FIB (Zeiss Auriga) in a metal film provided a simple way to generate resonances at given wavelengths (see for example Ebbesen, T. W., Lezec, H. J., Ghaemi, H. F., Thio, T. & Wolff, P. A. "Extraordinary optical transmission through sub-wavelength hole arrays" Nature 391, 667-69 (1998)). A molecular film was then spin-coated on the surface of the dimple or hole arrays and the period was varied to tune the SP resonance, strong coupling was generated when it matched the electronic transition. For the purpose of measuring conductivity, such hexagonal arrays were milled in the bottom Al mirror 3' separating the electrodes as illustrated in FIG. 12 and covered PDI2EH-CN$_2$.

More specifically, the configuration setup of FIG. 12 has been used to measure polariton conductivity using surface plasmon resonances generated by the hexagonal array of dimples milled in a 150 nm thick Al film, 50 μm wide, deposited on a glass substrate. The distance between the electrodes is 50 μm. PDI2EH-CN$_2$ was spin-coated, forming a 100 nm thick layer on the array. The dimple diameter is half the period and the gap between the array and the electrodes is 200 nm.

As can be seen in FIG. 13A, the conductivity reaches a maximum for a period of 320 nm which corresponds to the resonant condition. It is important to note that the hexagonal array was also milled on the edge of electrodes in a commensurate way with the central array, as illustrated in FIG. 12, to minimize the possibility of a high resistance area on the edge of the array in the interrogated zone.

Although the conductivity enhancement is smaller on plasmonic arrays, the link between the conductivity increase and the mobility was confirmed by gating experiments on hole array structures as shown in FIG. 10.

The device in this figure has a staggered structure and is composed of: Al (40 nm thick layer) acting as a top gate; ~600 nm thick layer of Cytop, a polymer dielectric acting as a gate insulator ($\in_r$=2.1); 100 nm of PDI2EH-CN$_2$ as the semiconductor layer; Al electrodes and a nanohole array structure (W=50 μm, L=50 μm). The surface plasmon modes may be modified by the application of the dielectric due the evanescent extent of the electromagnetic field through and beyond the semiconductor layer.

The reference device (bottom view on the right in FIG. 10) did of course not show any hole array structure.

FIGS. 11A and 11B illustrate the transfer characteristics ($I_D$-$V_G$) of top-gate bottom-contact FETs realised on the device structures proposed in FIG. 10. In particular, the graphs show the difference between a gated structure with hole arrays of periodicity p=280 nm (FIG. 11A) vs. a reference structure (FIG. 11B) with the same geometry but without any nanohole array. The ratio of the mobilities is $\mu_{FET[p=280\ nm]}/\mu_{FET[reference]}$~10 which corresponds essentially to the ratio of the current measured in the I-V curve.

The observed order of magnitude boost in conductivity corresponds to a similar increase in carrier mobility.

The reduced enhancement of the conductivity measured over hole arrays with respect to the results obtained in the Fabry-Perot configuration might stem from the fact that the plasmonic electric field in the polymer is essentially perpendicular to the metal film. It seems indeed consistent to assume that the field component involved in the polaritonic mediated conductivity is the longitudinal one which turns out to be much reduced with respect to the transverse one due to the relatively large optical contrast between the metal and the polymer.

The choice of metal Al for the electrical contact was made to inject carriers into P– since it is known that the electron injection is more favourable from low work-function metals. The large Rabi splittings naturally perturb the electronic structure of the semiconductors, pushing the ground state down and modifying the work-function as we have shown elsewhere (see previously mentioned publications of Hutchison J. A. et al. and Canaguier-Durant A. et al.). For instance the change in the work-function for PDI2EH-CN$_2$ was measured by the macroscopic Kelvin Probe technique on a resonant hole arrays and found to be ~0.1 eV. This change in work function could also possibly modify the I-V characteristics.

In relation to these series of experiments, the current enhancement surprisingly observed by the inventors in the strongly coupled organic semiconductors can a posteriori be explained by the extended coherence of the polaritonic state over lengths that correspond to the mode volume (~ on the scale of the wavelength of the resonance) in sharp contrast with the normal carrier that is mostly confined to the molecular (or a few molecules) scale, in particular at room temperature. Possibly the reduced effective mass derived from the dispersion of the polaritonic state (eq. 2) might also contribute by decreasing the carrier-phonon interaction. Another contribution to the conductivity enhancement could arise from the Rabi splitting bringing the carrier state closer to the Fermi level of the organic semiconductor.

Nevertheless like for all conductors, disorder can strongly hinder charge transport whatever the carriers. This seems to be confirmed by the lack of conductivity enhancement for P(NDI2OD-T2) and PDI2EH-Br$_2$ despite the efficient strong coupling. These materials are known to present more disorder, especially when spin-coated onto the samples as done here. Conversely, the PDI2EH-CN$_2$ family of molecules are known to stack well even under this preparation method and give good conductivities in agreement with the findings of the inventors (Jones, B. A., Ahrens, M. J., Yoon, M.-H., Facchetti, A., Marks, T. J. & Wasielewski, M. R. "High-mobility air-stable n-type semiconductors with processing versatility: Dicyanoperylene-3,4:9,10-bis(dicarboximides)" Angew. Chem. Int. Ed. 116, 6523-6526 (2004)).

Regarding the experimental circumstances having lead to the results exposed herein, the used devices were prepared and characterized as follows:

Al films were evaporated on glass substrates or PDMS (polydimethylsiloxane) blocks. The gaps between the electrodes and the bottom mirror were milled with a Zeiss Auriga Focused Ion Beam. The organic semiconductors were spin-coated on the surface to the desired thickness (except for N1100 which was thermally evaporated). The film thickness was measured with a profilometer. The top mirror on PDMS was then applied to the film and the strong coupling was checked by transmission spectroscopy (FIG. 2E) and by angular dispersion as illustrated for PDI2EH-CN$_2$ in FIG. 14.

The current-voltage measurements were carried out with a Keithley 2635 on two-terminal devices where a film of the above-mentioned materials would serve as the semiconductor film. The measurements were performed in ambient conditions between two electrodes.

In order to avoid any significant influence of contact effects, the inventors noticed that the drain and the source (two or three terminal devices) should be separated by at least 35 μm.

In relation to the foregoing specification, the invention also concerns, as illustrated very schematically by way of examples in FIGS. 3, 8, 9 and 10, an electronic, electro-optical, optoelectronic, photovoltaic or light emitting device comprising organic and/or molecular material 2 located in or on a reflective or photonic structure 1.

Said structure 1, which is part of the device 4, has an electromagnetic mode which is by design or can be made by way of adjustment or tuning, resonant with a transition in said organic material 2 and in controlling, in particular enhancing, the mobility of the charge carriers, and thus the electrical current, in said organic and/or molecular material 2, by means of strongly coupling said material 2 to the local electromagnetic vacuum field and exploiting the formation of extended macroscopic states in said material.

By way of two illustrative and alternative examples, the structure 1 can be made of two opposed reflective planar surface structures 3 and 3' (FIG. 3) or of a single plasmonic surface structure (FIGS. 8 and 9).

It should be noticed that with the constructive solution of FIG. 9, a fine tuning and regulation of the conductivity of the material 2 can be achieved by controlling the gate 6 (electrostatic gate control). Similar comments can be made in relation to the device shown on FIG. 10.

Therefore, the invention also encompasses a device 4 consisting of a three terminal gated device, such as a field effect transistor.

Of course, the invention is not limited to the preferred embodiments described and represented herein, changes can be made or equivalents used without departing from the scope of the invention.

The invention claimed is:

1. A method to modify the electrical properties of an organic and/or molecular material comprising:
   providing a reflective or photonic structure;
   placing said organic and/or molecular material in or on said structure;
   providing a structure which has an electromagnetic mode which is by design, or is made by way of adjustment or tuning, resonant with a transition in said organic and/or molecular material;
   controlling a conductivity, and thus mobility of the charge carriers, resulting in an increased electrical current, in said organic and/or molecular material, by strongly coupling said material to a local electromagnetic vacuum field; and
   exploiting a formation of states of spatial extension exceeding the size of molecules or polymer chains of said material.

2. The method according to claim 1, wherein a Q-factor, defined as a ratio of a wavelength of a resonance divided by a half-width of the resonance, a resonant electromagnetic mode is between 10 and 1 000.

3. The method according to claim 1, wherein the electromagnetic mode is a surface plasmon mode.

4. The method according to claim 1, wherein the electromagnetic mode is a cavity mode.

5. The method according to claim 4, wherein the cavity mode is defined by two opposed mirror structures.

6. The method according to claim 5, wherein the two opposed mirror structures are two parallel planar mirrors.

7. The method according to claim 1, wherein the reflective structure comprises at least one metallic surface made of a metal film or of two opposed metal films.

8. The method according to claim 1, wherein the transition in the molecules of the material is an electronic transition.

9. The method according to claim 1, wherein the transition in the molecules of the material is a vibrational transition.

10. The method according to claim 1, wherein, by coupling to the local electromagnetic vacuum field and exploiting a resulting rearrangement of the energy levels of the molecules of the material, in inducing a formation of hybrid light-matter Dicke states in the organic material in order to increase conductivity of the organic material and the charge carrier mobility, said Dicke states extending over a large number of molecules of the material.

11. The method according to claim 10, wherein said Dicke states extend over an area extending at least 100 nm in all directions.

12. The method according to claim 1, wherein the method is applied in a functional device comprising said reflective or photonic structure, said device being one of an electronic device, an electro-optical device, an optoelectronic device, a photovoltaic device or a light emitting device.

13. The method according to claim 1, wherein a Q-factor, defined as a ratio of a wavelength of a resonance divided by a half-width of the resonance, a resonant electromagnetic mode is between 10 and 100.

* * * * *